(12) United States Patent
King et al.

(10) Patent No.: US 8,004,271 B2
(45) Date of Patent: Aug. 23, 2011

(54) SELF CONTAINED KILOWATT-HOUR METER INTEGRAL TO STANDARD LOAD CENTER

(75) Inventors: William A. King, Loganville, GA (US); Solomon R. Titus, Cumming, GA (US); Harry Haas, Atlanta, GA (US); James O. Alexander, Decatur, GA (US); Mario Bilac, Lawrenceville, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 38 days.

(21) Appl. No.: 12/551,891

(22) Filed: Sep. 1, 2009

(65) Prior Publication Data

US 2010/0052655 A1 Mar. 4, 2010

Related U.S. Application Data

(60) Provisional application No. 61/093,883, filed on Sep. 3, 2008.

(51) Int. Cl.
G01R 11/63 (2006.01)

(52) U.S. Cl. .................................................. 324/103 R
(58) Field of Classification Search .................. None
See application file for complete search history.

(56) References Cited

U.S. PATENT DOCUMENTS

| | | | | |
|---|---|---|---|---|
| 3,764,956 | A * | 10/1973 | Norden | 439/259 |
| 5,994,892 | A * | 11/1999 | Turino et al. | 324/142 |
| 7,298,134 | B2 * | 11/2007 | Weikel et al. | 324/142 |
| 2007/0007944 | A1 * | 1/2007 | Burns et al. | 324/142 |
| 2009/0278706 | A1 * | 11/2009 | Giubbini | 340/870.02 |

* cited by examiner

*Primary Examiner* — Huy Q Phan
*Assistant Examiner* — Arleen M Vazquez
(74) *Attorney, Agent, or Firm* — Jose R. de la Rosa

(57) ABSTRACT

The present invention relates generally to a load center. More particularly, the invention encompasses a self contained kilowatt-hour meter which is integral to a standard load center. The present invention is also directed to a novel printed circuit board and housing for the self contained kilowatt-hour meter. The self contained kilowatt-hour meter of this invention measures the energy usage of a facility, such as, residential unit, a house, an apartment, a condominium, and then it communicates the energy usage in a timely manner or as desired to a local requester, such as, the owner, occupant or any other entity, as well as, to another requester, such as, a remote requester, for example, an energy provider.

38 Claims, 9 Drawing Sheets

SELF CONTAINED KILOWATT-HOUR METER INTEGRAL TO STANDARD LOAD CENTER

CROSS-REFERENCE TO RELATED APPLICATION

The instant patent application claims priority to and the benefit of U.S. Provisional Patent Application Ser. No. 61/093,883, filed on Sep. 3, 2008, titled "Self Contained Kilowatt-Hour Meter Integral to Standard Load Center," the entire disclosure of which provisional application is incorporated herein by reference.

FIELD OF THE INVENTION

The present invention relates generally to a load center. More particularly, the invention encompasses a self contained kilowatt-hour meter which is integral to a standard load center. The present invention is also directed to a novel printed circuit board and housing for the self contained kilowatt-hour meter. The self contained kilowatt-hour meter of this invention measures the energy usage of a facility, such as, residential unit, a house, an apartment, a condominium, and then it communicates the energy usage in a timely manner or as desired to a local requester, such as, the owner, occupant or any other entity, as well as, to another requester, such as, a remote requester, for example, an energy provider.

BACKGROUND INFORMATION

Every residence requires an energy meter to measure electrical energy that is used by that household. Presently, this is accomplished by a wide variety of devices: both electromechanical and electronic. Many of the newest meters also provide a means of communicating energy usage readings to a remote collection point so that power companies do not require anyone to actually visit each meter for a monthly reading. Yet this new technology still lacks the ability to get this information directly to the customer. What all of these devices share in common is that they plug into a standard socket at the residential service entrance. However, none of these energy reading meters provide a local display of energy usage or communicate this information to the local user of the energy.

Therefore there is a need for improvement in a load center and in particular a load center that has a self contained kilowatt-hour meter.

This invention improves on the deficiencies of the prior art and provides an inventive load center that has a self contained kilowatt-hour meter.

PURPOSES AND SUMMARY OF THE INVENTION

The invention is a novel self contained kilowatt-hour meter.

Therefore, one purpose of this invention is to provide a self contained kilowatt-hour meter.

Another purpose of this invention is to provide a self contained kilowatt-hour meter that can be integrated into a standard load center.

Still another purpose of this invention is to provide an economic solution to a standard load center by integrated it with at least one self contained kilowatt-hour meter.

Yet another purpose of this invention is to provide a robust self contained kilowatt-hour meter which is integrated with a standard load center.

Therefore, in one aspect this invention comprises a self contained kilowatt-hour meter, comprising:
(a) a meter housing having at least two openings for the passage of at least one electrical connection;
(b) a middle assembly comprising at least one printed circuit board, at least two toroidal transformers, and at least two openings for the passage of at least one electrical connection, such that each of said toroidal transformer is adjacent each opening for the passage of at least one electrical connection;
(c) a meter cover having at least two openings for the passage of at least one electrical connection; and
(d) at least one securing means to secure said meter cover to said meter housing such that said middle assembly is contained inside said meter cover and said meter housing, and wherein each of said at least two openings for the passage of at least one electrical connection are substantially aligned each with other, and thereby forming said self contained kilowatt-hour meter.

In another aspect this invention comprises an electrical load center comprising:
(a) at least one main circuit breaker connected to AC power lines for transferring electrical energy for use by a local user or resident; and
(b) a load center meter proximal to the at least one main circuit breaker comprising:
an enclosure containing at least two openings through which at least one AC power line is conveyed through each opening to connect to the at least one main circuit breaker; and
a load center meter connected for monitoring the electrical energy used by the local user or resident, said load center comprising:
at least one current sense device for sensing a current transferred through the at least one power line and generating a current signal representing the current on the AC power line,
at least one voltage sense device for sensing a voltage present on the at least one AC power line and generating a signal representing the voltage present on the at least one AC power line,
a measurement circuit in communication with the at least one current sense device and the at least one voltage sense device for determining an active, reactive, and apparent energy level, RMS (root mean square) and instantaneous values for current and voltage, and line frequency information of the electrical energy used by the local user or resident,
a data analyzer analyzes the active, reactive, and apparent energy, RMS and instantaneous values for current and voltage, and line frequency information to create the energy usage data, and
a data storage device in communication with the data analyzer to receive and retain the active, reactive, and apparent energy, RMS and the instantaneous values for current and voltage, the line frequency information, and the energy usage data.

In yet another aspect this invention comprises a load center meter proximal to at least one main circuit breaker within a load center comprising:
(a) an enclosure containing at least two openings through which at least one AC power line is conveyed through each opening to connect to the at least one main circuit breaker; and
(b) a load center meter place within the enclosure connected for monitoring the electrical energy used by the local user or resident, said load center comprising:
at least one current sense device for sensing a current transferred through the at least one power line and generating a current signal representing the current on the AC power line, at least one voltage sense device for sensing a voltage present on the at least one AC power line and generating a signal representing the voltage present on the at least one AC power line, a measurement circuit in communication with the at least one current sense device and the at least one voltage sense device for determining an active, reactive, and apparent energy level, RMS (root mean square) and instantaneous values for current and voltage, and line frequency information of the electrical energy used by the local user or resident, a data analyzer analyzes the active, reactive, and apparent energy, RMS and instantaneous values for current and voltage, and line frequency information to create the energy usage data, and a data storage device in communication with the data analyzer to receive and retain the active, reactive, and apparent energy, RMS and the instantaneous values for current and voltage, the line frequency information, and the energy usage data.

BRIEF DESCRIPTION OF THE DRAWINGS

Although the scope of the present invention is much broader than any particular embodiment, a detailed description of the preferred embodiment follows together with drawings. These drawings are for illustration purposes only and are not drawn to scale. Like numbers represent like features and components in the drawings. The invention may best be understood by reference to the ensuing detailed description in conjunction with the drawings in which.

DETAILED DESCRIPTION

This invention secures the inventive kilowatt-hour meter within the standard load center. This reduces installation costs by eliminating the meter socket. Additionally this inventive metering device allows not only the power companies to get energy measurements, but also the local user or resident, who can now get the same information that the energy provider is getting in a timely manner, such as, hourly, daily, weekly, monthly, or any other desired schedule. This invention also allows a local user or resident to get instant and up-to-date cost of energy information utilizing an energy display unit that communicates with the load center meter.

Figure 1:
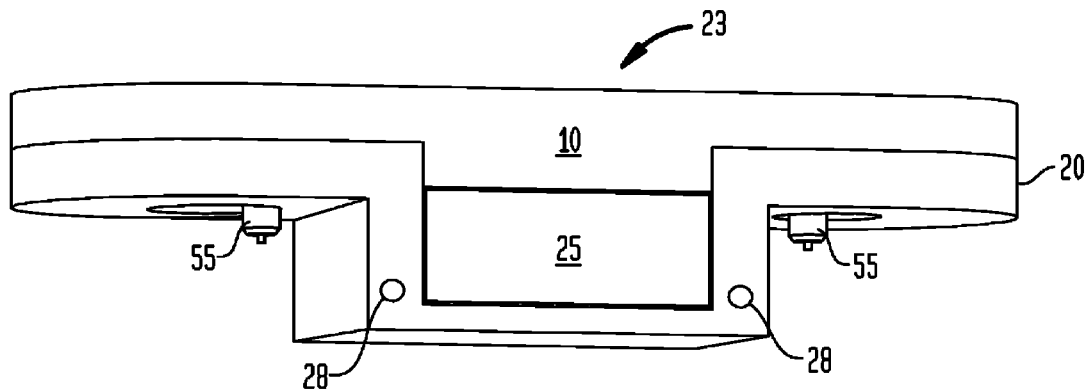
FIG. 1 illustrates a first embodiment of an inventive self contained kilowatt-hour meter of this invention.
Figure 3:
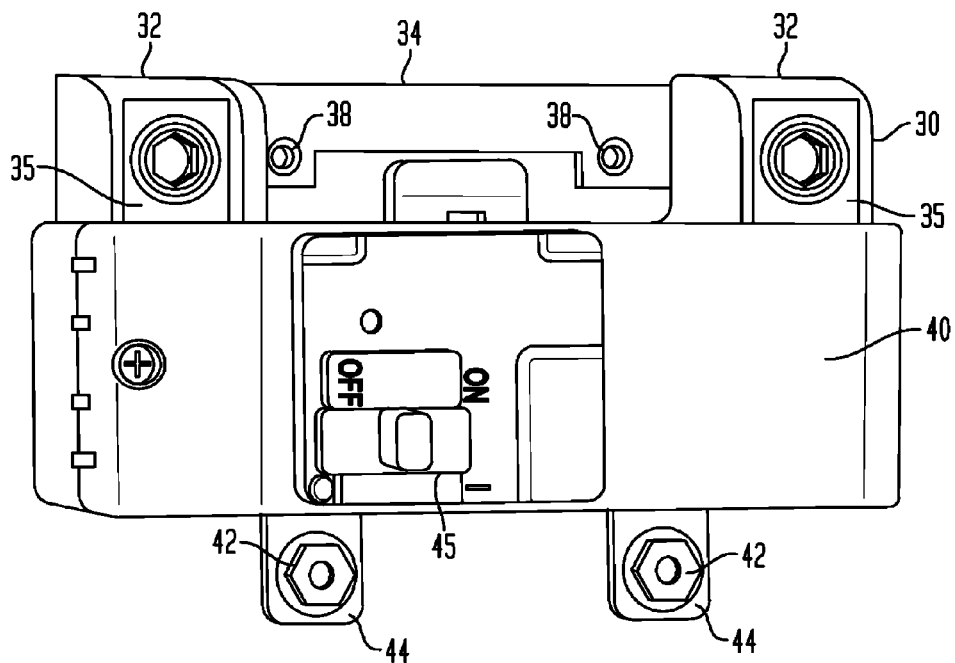
FIG. 3 is a front view showing a meter mounting assembly secured to a main breaker.

FIG. 1 illustrates a first embodiment of an inventive self contained kilowatt-hour meter 23, of this invention. The meter 23, comprises of a meter cover 10, which is secured to a meter housing 20. Holes or openings 28, allow the meter 23, to be secured to a meter mounting bracket or assembly 30, shown in FIG. 3. The self contained kilowatt-hour meter 23, is powered via two spring pins 55, located in such a way so as to make electrical contact with the corresponding lugs or lock nut 35, as shown in FIG. 3. An optional display 25, can also be provided with the meter 23.

Figure 2:
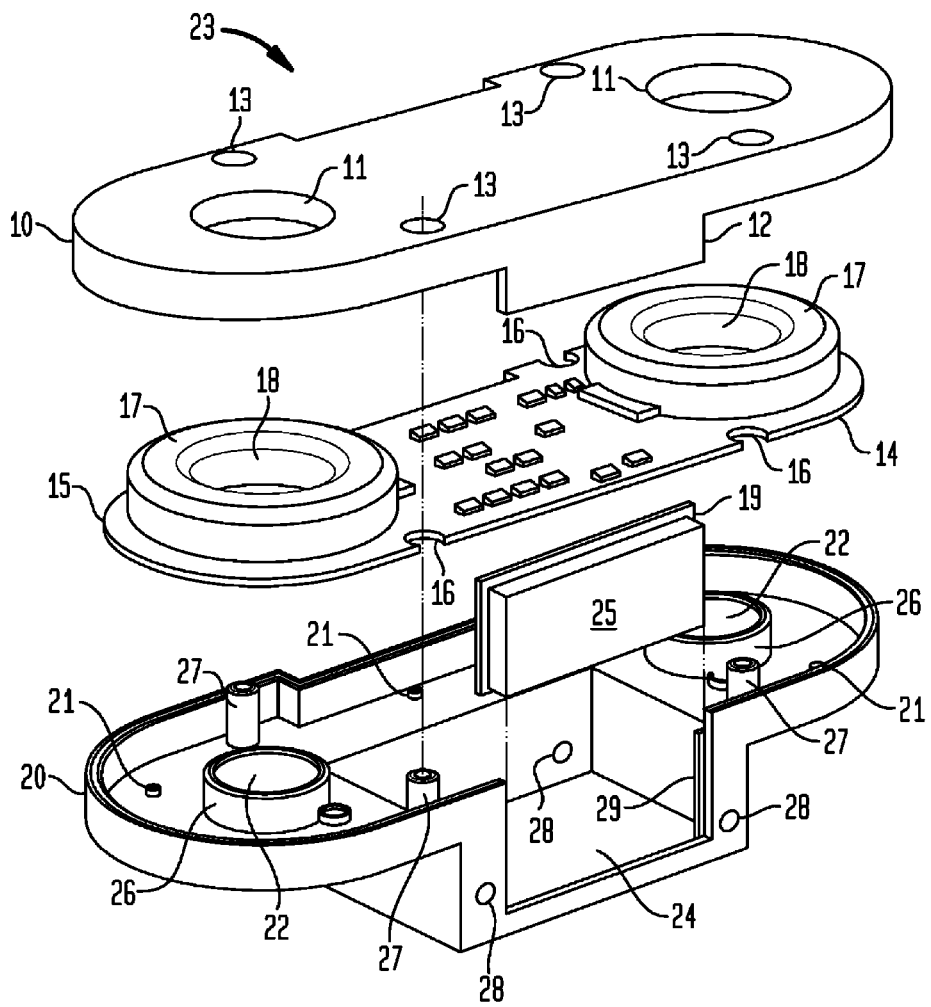
FIG. 2 is an exploded view of the inventive self contained kilowatt-hour meter of this invention.

FIG. 2 is an exploded view of the inventive self contained kilowatt-hour meter 23, of this invention. The inventive self contained kilowatt-hour meter 23, basically comprises of the meter cover 10, a meter housing 20, a middle assembly 15, and an optional display 25. The meter cover 10, has at least two holes or openings 11, for an electrical connection, such as, a wire, not shown. The meter cover 10, is preferably provided with a plurality of assembly holes or openings 13 that are used to secure the meter cover 10, to the meter housing 20. The meter cover 10, could also have an optional lip or extension 12, to support and secure a lip or ridge 19, of a display 25. The middle assembly 15, basically comprises of at least one printed circuit board (PCB) 14, and at least two toroidal transformers 17. The toroidal transformers 17, have at least one opening or hole 18, for the passage of an electrical connection, such as, a wire. The middle assembly 15, also has a plurality of cut-outs or notches or openings 16, to allow for the passage of a securing device (not shown). The meter housing 20, preferably has a plurality of stand-offs 21, to support and secure the middle assembly 15, inside the meter housing 20. The meter housing 20, also has holes or openings 22, for the passage of an electrical connection, such as, a wire (not shown). Preferably, a plurality of stand-offs 27, are also provided in the meter housing 20. The stand-offs 27, are in-line with the openings 13, and 16, such that a securing device (not shown) can be inserted into the stand offs 27, via the openings 13, and 16, to secure the meter cover 10, to the meter housing 20. The meter housing 20, is also provided with at least one opening or hole 28, such that a securing device 58, (shown in FIG. 5) can be inserted into the opening 28, and secured to feature 38, shown in FIG. 4. The meter housing 20, preferably has a lip or ledge or wall 26, around the opening 22, to accommodate the toroidal transformers 17, and prevent any sliding movement of the middle assembly 15. The cut-out or opening or notch 16, slides along the outer surface of the standoffs 27, and this prevents the sliding or any lateral movement of the middle assembly 15. The meter housing 20, can also be provided with an optional well 24, having channels 29, to accommodate the display 25. Basically, the lip or ledge 19, of the display 25, slides into the channel 29, and upon assembly the display 25, is held in place by the channel 29, and the lip 12.

FIG. 3 is a front view showing a meter mounting assembly or bracket 30, secured to a main breaker 40. The meter mounting assembly 30, has at least two lock nuts 35, having holes or openings 32, to accommodate an electrical connection, such as, a wire. The meter mounting assembly 30, has a bracket 34, having at least two openings 38, to accommodate securing means 58, shown in FIG. 5, that passes through openings 28, in the self contained kilowatt-hour meter 23. The main breaker 40, preferably has at least one OFF/ON switch 45, and a plurality of brackets 44, having securing means 42. The securing means 42, secure the main breaker 40, to a standard load center 50, shown in FIG. 5.

Figure 4:
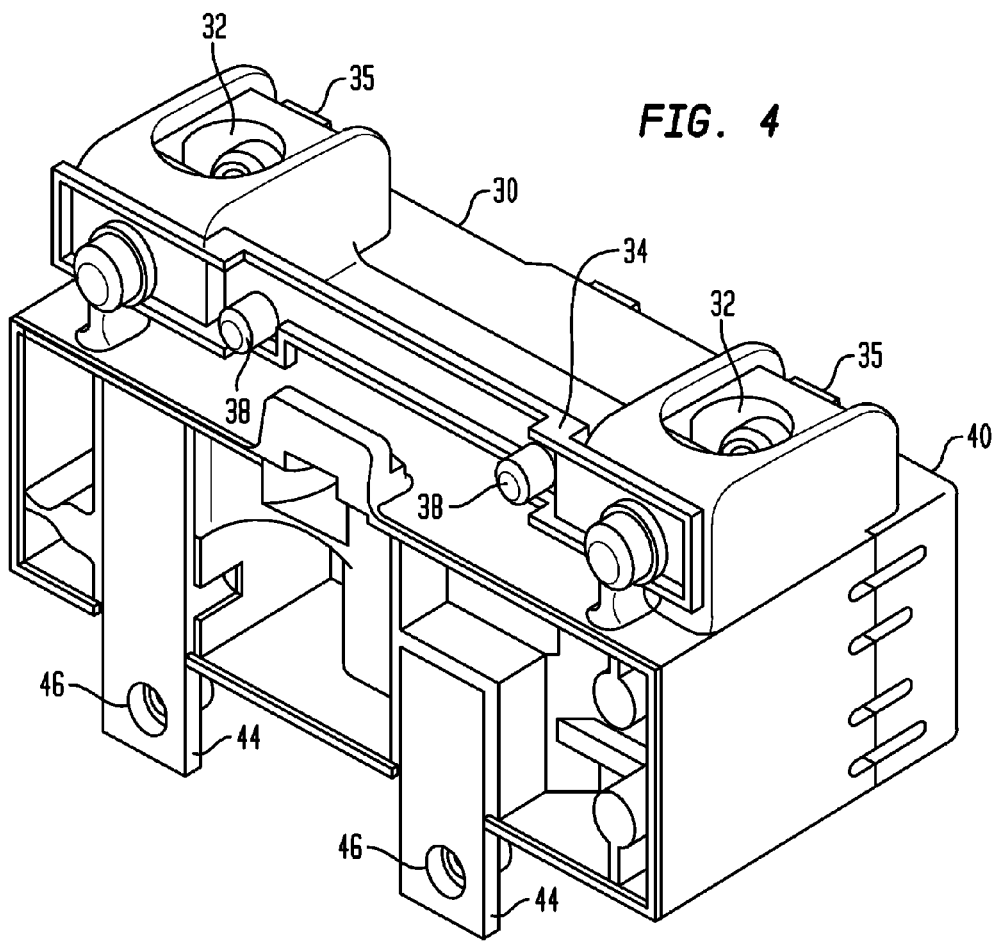
FIG. 4 is a rear view showing a meter mounting assembly secured to a main breaker.

FIG. 4 is a rear view showing a meter mounting assembly 30, secured to a main breaker 40. As one can see that the main breaker 40, has openings 46, in the bracket 44, for the passage of the securing means 42.

Figure 5:
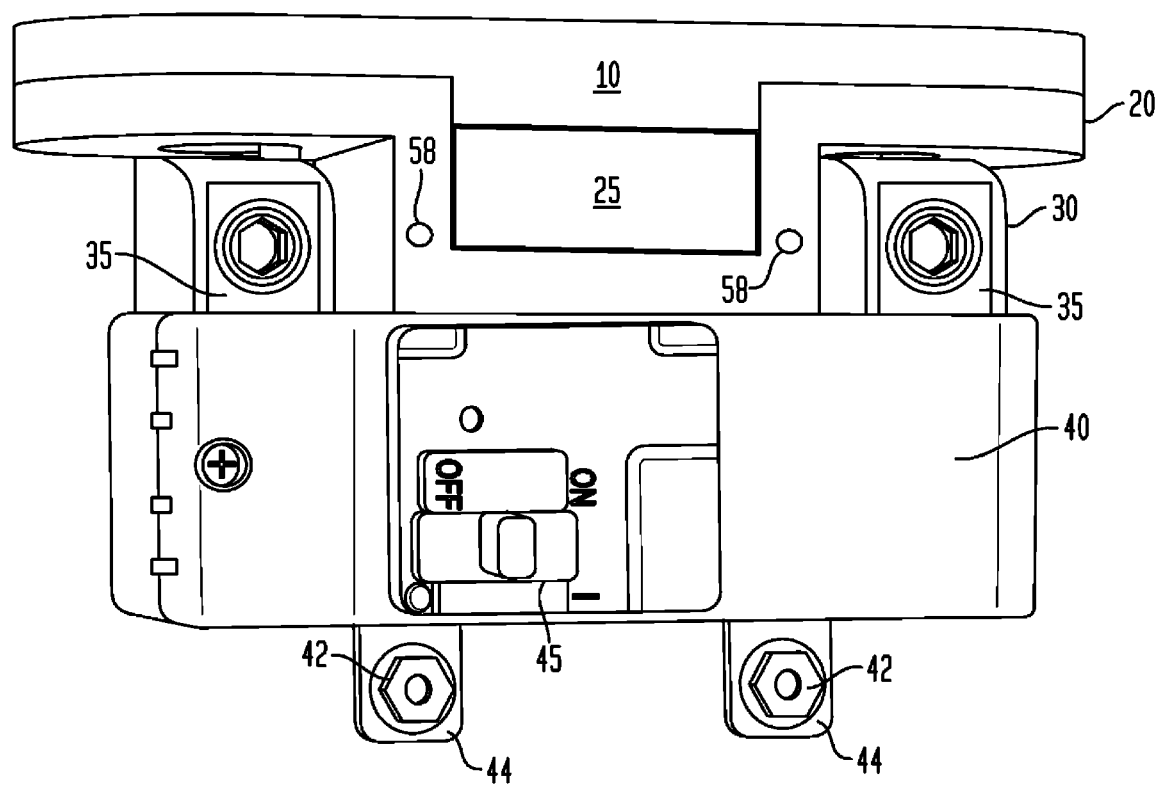
FIG. 5 is a front view of the inventive self contained kilowatt-hour meter of this invention secured to a meter mounting assembly and a main breaker.

FIG. 5 is a front view of the inventive self contained kilowatt-hour meter 23, of this invention secured to a meter mounting assembly 30, and a main breaker 40. As one can see that the self contained kilowatt-hour meter 23, is secured via securing means 58, to the meter mounting assembly 30, while the main breaker 40, is secured to a load center 50, via securing means 42.

Figure 6:
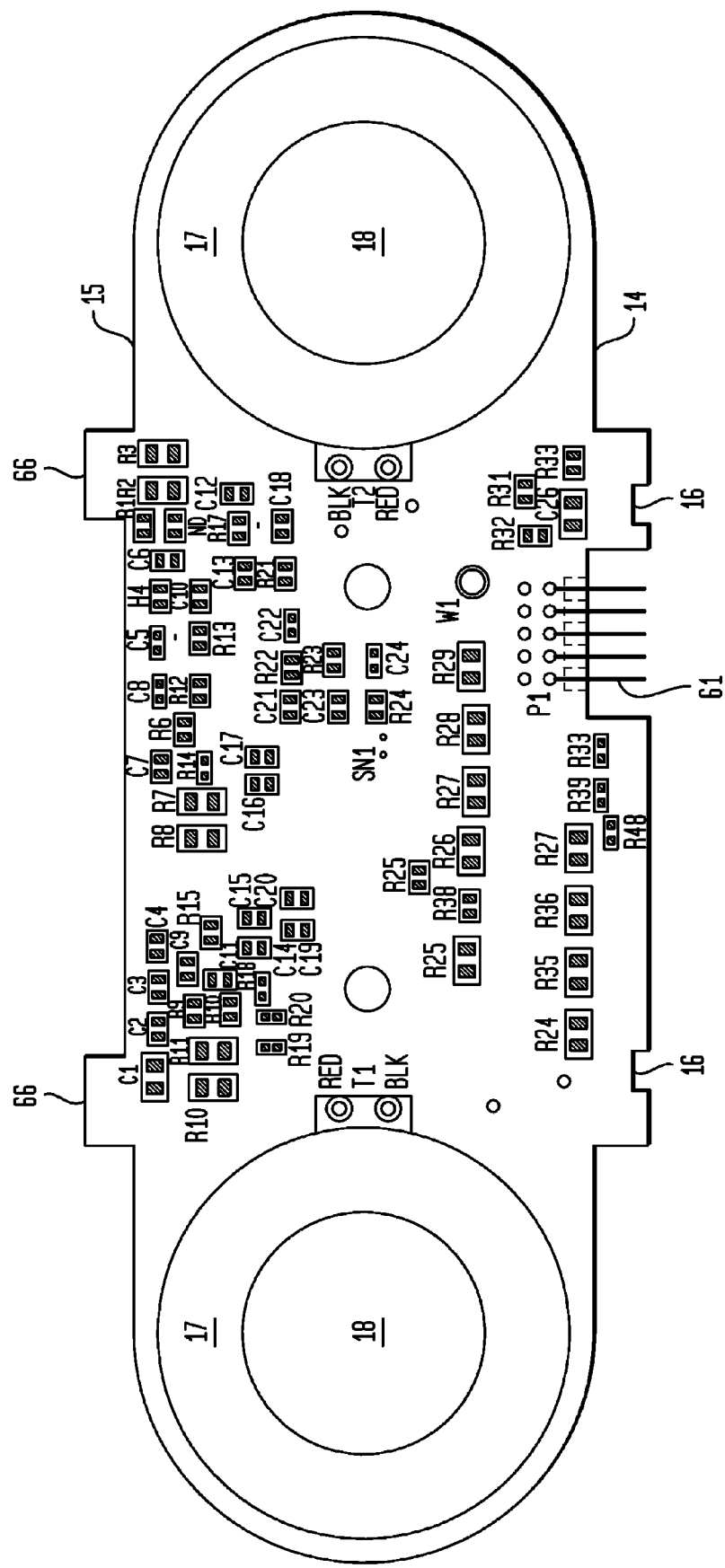
FIG. 6 is a detailed top view of an embodiment of a middle assembly of the inventive self contained kilowatt-hour meter of this invention.

FIG. 6 is a detailed top view of an embodiment of a middle assembly 15, of the inventive self contained kilowatt-hour meter 23, of this invention. The printed circuit board 15, has pins 61, that connect to the back of the display 25, and allows the display 25, to display digital data. The middle assembly 15, can have a plurality of openings or cut-outs or notches 16, and a plurality of notches or protrusions 66. The cut-outs 16, and the protrusions 66, are used to secure the middle assembly 15, inside the meter housing 20.

Figure 7:
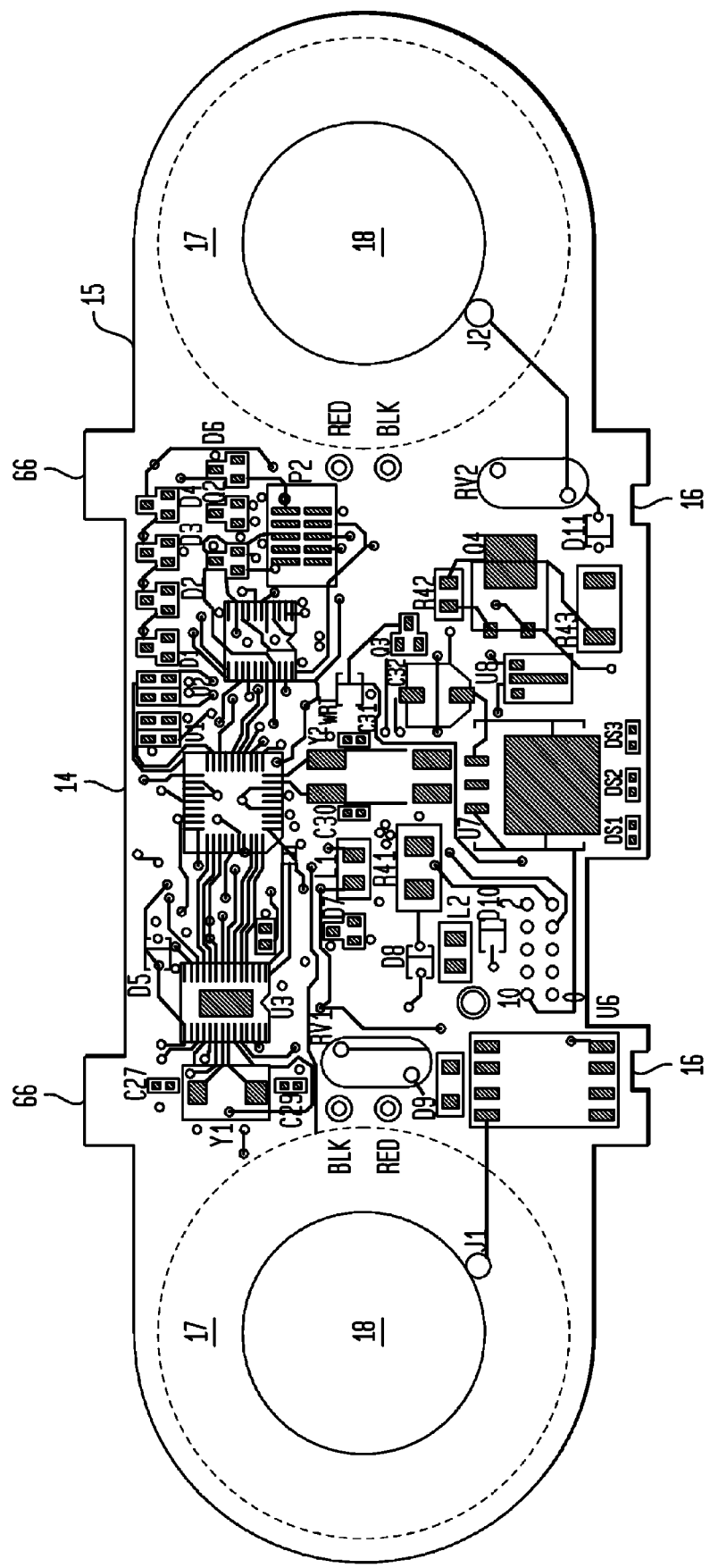
FIG. 7 is a detailed bottom view of an embodiment of a middle assembly of the inventive self contained kilowatt-hour meter of this invention.

FIG. 7 is a detailed bottom view of an embodiment of a middle assembly 15, of the inventive self contained kilowatt-hour meter 23, of this invention. As shown the toroidal transformers 17, are on the upper surface of the middle assembly 15, however, for some applications the toroidal transformers 17, and the associated circuitry could be on back or bottom side of the middle assembly 15.

Figure 8:
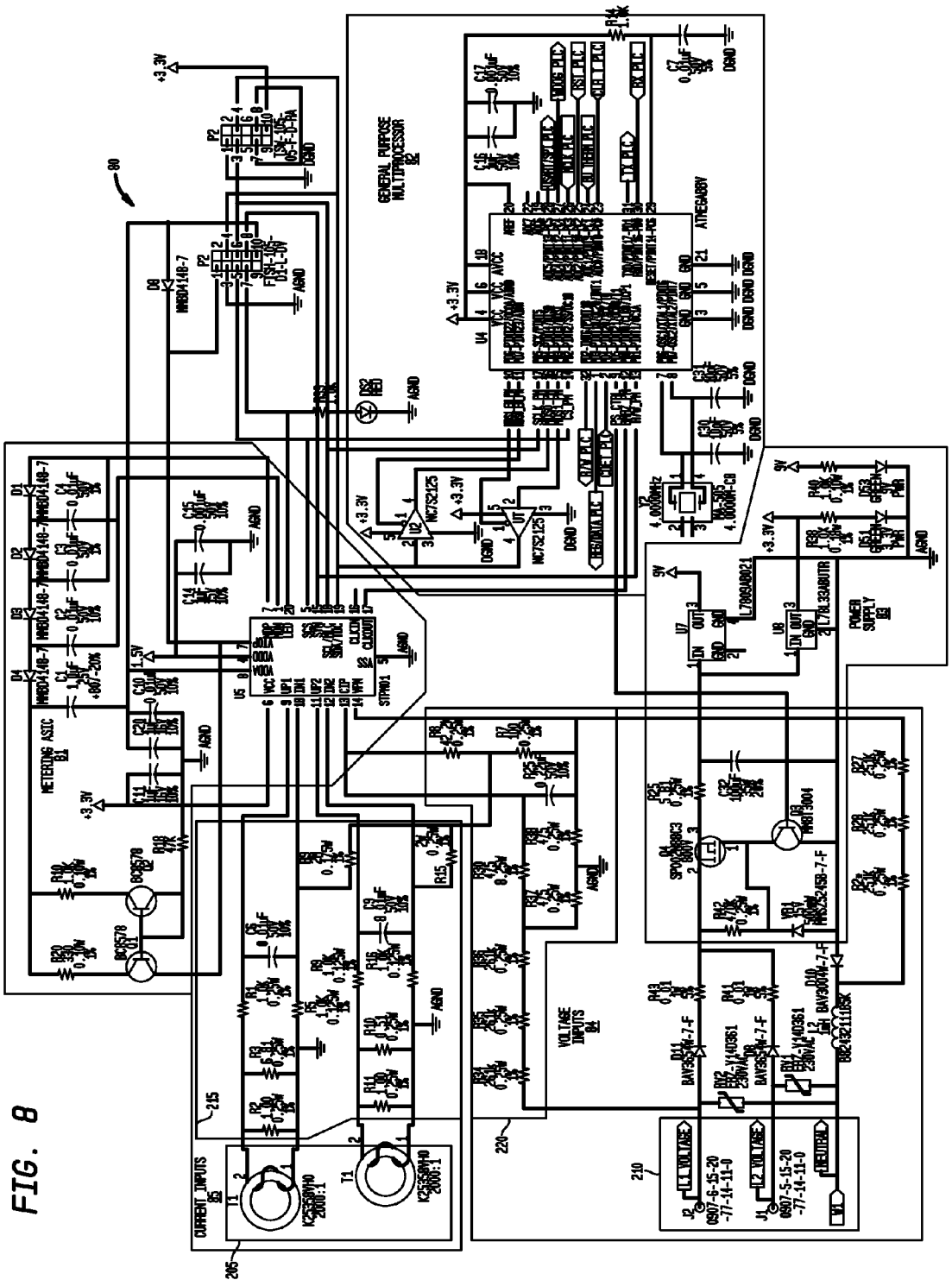
FIG. 8 is a detailed first circuit schematic of an embodiment of the inventive self contained kilowatt-hour meter of this invention.

FIG. 8 is a detailed first circuit schematic 80, of an embodiment of the inventive self contained kilowatt-hour meter 23, of this invention. The first circuit schematic 80, comprises basically of at least one metering ASIC (Application Specific Integrated Circuit) 81, at least one general purpose microprocessor 82, at least one power supply 83, at least one voltage input circuit 84, and at least one current input circuit 85.

Figure 9:
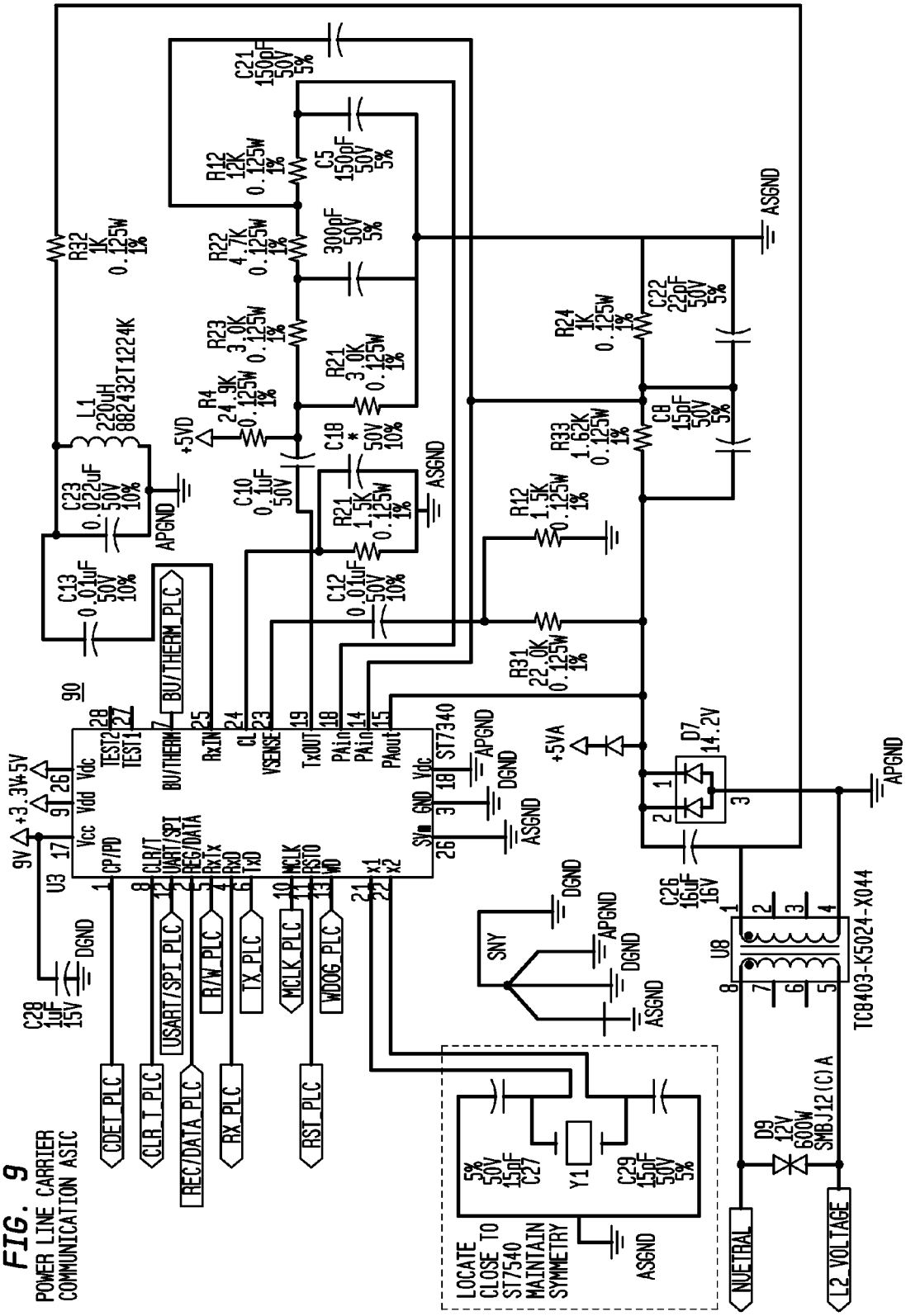
FIG. 9 is a detailed second circuit schematic of an embodiment of the inventive self contained kilowatt-hour meter of this invention.

FIG. 9 is a detailed second circuit schematic 90, of an embodiment of the inventive self contained kilowatt-hour meter 23, of this invention. The second circuit schematic 90, comprises of at least one power line carrier communications ASIC 90.

Figure 10:
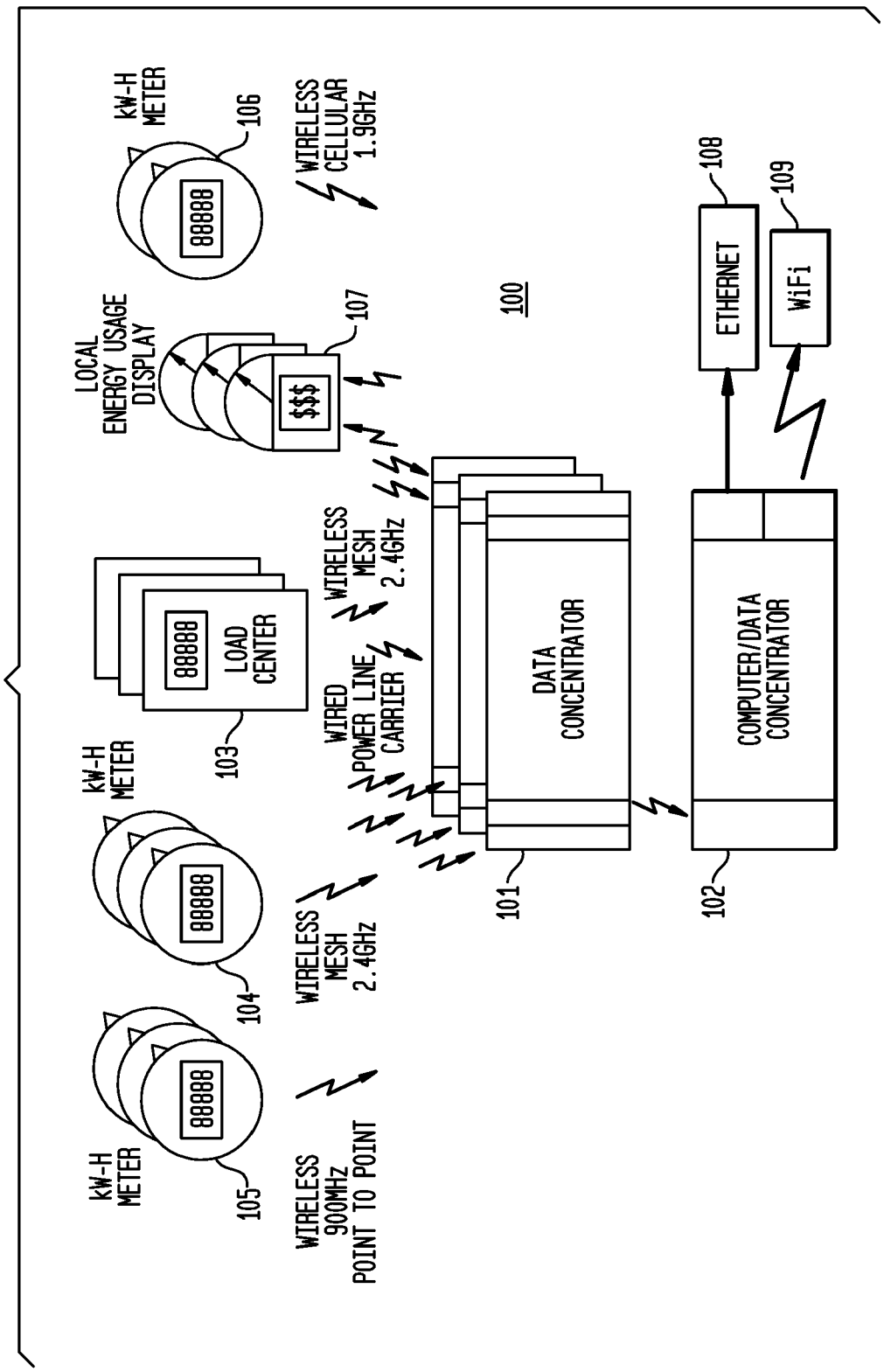
FIG. 10 is a yet another embodiment of the inventive self contained kilowatt-hour meter of this invention utilizing a wireless network.

FIG. 10 is a yet another embodiment of the inventive self contained kilowatt-hour meter 23, of this invention utilizing a wireless network 100. The wireless network 100, can comprise of at least one data concentrator 101, and at least one load center 103. The wireless network 100, can further comprise of at least one kilowatt-hour meter 104, 105, 106, where, for example, kilowatt-hour meter 104, communicates with the data concentrator 101, using wireless mesh at 2.4 GHz, while kilowatt-hour meter 105, communicates with the data concentrator 101, using wireless 900 MHz Point-to-Point, and kilowatt-hour meter 106, communicates with the data concentrator 101, using wireless cellular at 1.9 GHz. The data concentrator 101, can then transmit the desired data to the local energy display 107, using any of the known wireless communication protocols. The data concentrator 101, can also communicate the received data to another computer 102, or a data concentrator 102, having a display and a keypad. The received energy data can also be transmitted to another device or location using at least one Ethernet 108, or at least one WiFi 109. It should be appreciated that the data concentrator 101, preferably has the ability to communicate with each of the devices using any of the known wireless protocols. This can be done by providing the data concentrator with card slots that are interchangeable.

As stated earlier, the inventive self contained kilowatt-hour meter 23, of this invention is secured to a standard load center 50, having a main breaker 40. Preferably, the self contained kilowatt-hour meter 23, is in an insulated modular package that will attach directly to the main breaker 40. The two main conductors (not shown) feed through the openings 11, 18, 22, 32, and into the lugs of the main breaker 40. These conductors pass through the current transformers 17, in the self contained kilowatt-hour meter 23, providing inputs proportional to the current in the mains. In addition pins (J1 and J2) on the meter module will contact each lug providing voltage inputs. A pigtail wire (not shown) must be connected to the neutral bus to provide a reference for the self contained kilowatt-hour meter 23.

The self contained kilowatt-hour meter 23, shown in FIG. 1, comprises of a multipart plastic enclosure 10, 20, containing a single electronic circuit assembly 15. The enclosures 10, 20, provides several functions including insolating the circuit from wires and debris inside the load center 50, funneling the mains conductors into the lugs, supporting spring loaded pin connections to the lugs for voltage inputs, optional front panel LCD, and attachment to the main breaker 40, from the bottom side to resist tampering. The enclosures 10, 20, preferably use, securing means, such as, screws, to attach the two halves 10, 20, enclosing the electronics 15, and capturing a spacer 25, if no display 25, is present. Then two securing devices 58, such as, screws 58, can be used to attach the self contained kilowatt-hour meter 23, to the main breaker 40, via the meter mounting bracket or assembly 30.

As stated earlier that there are preferably two distinct parts to the electronic circuitry 14. The first is the actual energy metering circuit 80, shown in schematic, as FIG. 8, including a power supply 83, and the second is a communications circuit 90, as shown in FIG. 9. The energy meter 23, begins with a power supply circuit 83, that creates regulated low voltage DC power from the AC mains by rapidly switching the mains on and off via a high voltage FET (Q4) with feedback to control the turn on/off timing (Q3). The resulting pulsed voltage is then filtered using a large capacitor (C32) and fed into linear voltage regulators (U7 & U8) to provide stable low voltage power for the microprocessor (U4) and ASICs (U5 and surrounding components). Next is a circuit composed of current transformers (T1 & T2) which generate a current proportional to that of the load center mains and resistive dividers which generate voltages directly proportional to the mains voltages. These signals are then further scaled (the scaling circuitry between transformers and U5), filtered and sent to an integrated circuit specifically designed to measure energy (U5). This component (U5) measures active, reactive, and apparent energy, RMS (root mean square) and instantaneous values for current and voltage, and line frequency information. In addition to this application specific integrated circuit, there is a general purpose microprocessor (U4), such as, an Atmel ATMEGA88, that analyzes and stores the energy usage data. The ATMEGA88 was chosen from many alternatives due to its built-in communications ports, variable memory configurations, processing capability, and low cost. The ASIC and microprocessor communicate with each other via a common serial peripheral interface. At this point the data can be made available for the customer, either by display on an optional LCD or by transmission to a remote receiver.

The second part of the electronics circuitry is another ASIC (Application Specific Integrated Circuit) (U3). This one is designed to communicate digital data across a power line, such as, for example, ST Microelectronics ST7540. This portion of the circuit could easily be replaced by a circuit for wireless communication using whatever protocol the customer chooses. It is preferred to communicate over the power lines because it is most economical, and the wiring is already provided.

As stated earlier that the wireless communications from inside a load center 50, would be more difficult and expensive requiring isolation of low voltage wiring, an external antenna and modification to the standard cabinet. Data from the general purpose microprocessor is transferred to the communications ASIC via an asynchronous communication interface. The ASIC then generates signals that are coupled onto the power line using a small signal transformer. These signals can then be picked up by a remote receiver and displayed by a computer or other special purpose display device or by an energy provider to be used for monitoring, billing, or other purposes.

Furthermore, FIG. 10, shows the integration of the load center meter 23, 50, with a wireless system 100. This wireless system 100, includes data concentrators 101, which are devices used to collect and compress data from a multitude of meters. These could be electric, gas, or water using conventional point to point wireless communications, such as, Itron Open-Way, or many other potential communications means, such as, Zigbee, cellular, Wi-fi, or even wired schemes, such as, Modbus or PLC (Power Line Carrier). The data concentrators 101, are computer-like devices with add-in cards for the various communications methods. Each of the data concentrators 101, would in turn be able to send their information to a local computer or data concentrator 102, with display/keyboard which could then display, process, and transfer the data to the appropriate providers.

Figure 11:
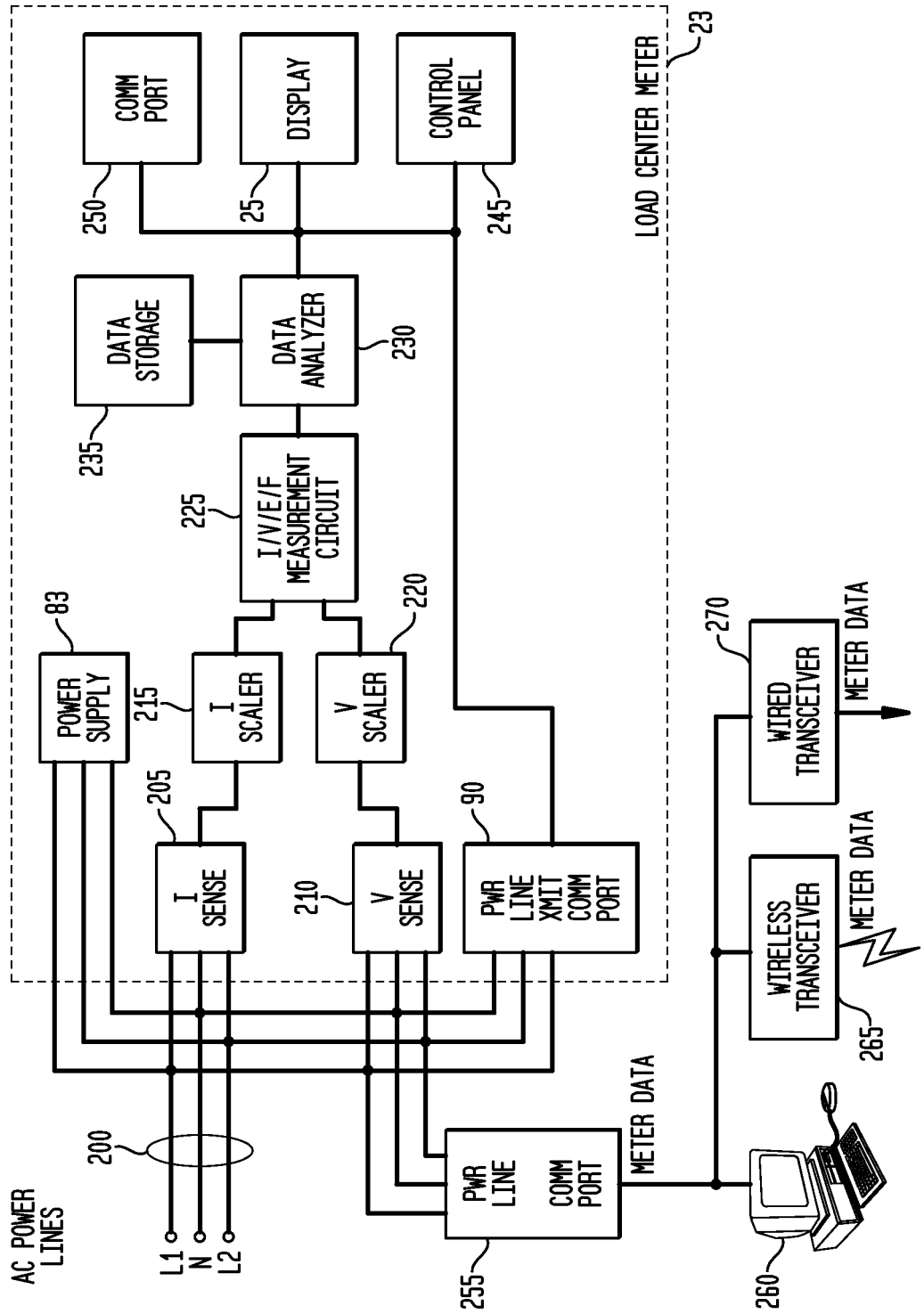
FIG. 11 is a generalized functional block diagram of an inventive load center meter of this invention.

FIG. 11 illustrates the functional structure of the load center meter 23. The AC power lines (L1, L2, and neutral N) 200 are connected to the load center meter 23 at the main breaker 40 of FIGS. 3, 4, 5. The AC power lines 200 are connected to the current sense circuit 205 and the voltage sense circuit 210 for providing the inputs for the sampling the power line current and voltage as being consumed by local user or resident. The current sense circuit in the embodiments as shown are the toroidal transformers 17 T1 and T2 of FIG. 8. The terminal points J1 and J2 for the power lines L1 and L2 and terminal H1 connected to the pig tail that is connected to the neutral wire form the voltage sense circuit 210.

The output of the current sense circuit 205 is the input to the current scaler 215. The current scaler 215 is formed by a voltage divider circuit and filter placed between the toroidal transformers 17 T1 and T2 and the measurement ASIC U5 of FIG. 8. The current scaler scales the voltage present at the outputs of the current sense circuit 205 (the toroidal transformers 17 T1 and T2) proportionally to the current present in the power lines L1 and L2 for transfer to the measurement circuit 220 (ASIC U5 of FIG. 8).

The output of the voltage sense circuit 210 is the input to the voltage scaler 220. The voltage scaler 220 is formed of the voltage divider and filter formed between the terminal J2 and the ASIC U5 of FIG. 8. The voltage scaler 220 scales the power line voltage present at the voltage sense circuit 210 (terminal J2) proportionally for transfer to the measurement circuit 220. The measurement circuit 220 determines the active, reactive, and apparent energy, RMS and instantaneous values for current and voltage, and line frequency of the AC power lines 200. The active, reactive, and apparent energy, RMS and instantaneous values for current and voltage, and line frequency information is transferred to the data analyzer 230. The data analyzer 230 transfers the active, reactive, and apparent energy, RMS and instantaneous values for current and voltage, and line frequency information is placed in the data storage 235. The data analyzer analyzes the active, reactive, and apparent energy, RMS and instantaneous values for current and voltage, and line frequency information to create the energy usage data that is transferred to the display 25 for monitoring by the local user or resident or to a communication port 250 for transfer externally to the load center meter 23. An optional control panel 245 is shown such that input command and programming signal may entered through the control panel for programming, maintenance, or diagnostics of the load center meter 23. Alternately, these functions may be communicated through the communications port 250.

The data analyzer 230, the data storage 235, the interface to the display 25, the interface to the control panel 245, and the communications port 250 are integrated into the function of the microprocessor 82 of FIG. 8. The Atmel ATMEGA88 of the embodiment provides 512 bytes of EEPROM storage and 1K bytes of SRAM storage for the data storage 235. An asynchronous communication port is present for the communications port 250. The display 25 and control panel 245 may communicate through the asynchronous communication port or through the other data ports of the microprocessor.

The power line communications port 90 as described in FIG. 9 provides an alternate communication port to external circuitry through the AC power lines. The electrical usage data is transferred to the power line communication port 90 and then transmitted from the power line communication port 90 on the AC power lines 200 to a remote power line communication port 255 that receives the electrical usage data. The remote power line communication port 255 transfers the usage data to a personal computer 260 for review by the local user or resident or to a wireless transmitter 265 or wired transmitter 270 for transfer to data concentrators 101 of FIG. 10 for transfer to an electrical utility provider for billing, usage monitoring, and other purposes as needed.

The power supply 83 as explained above is connected to the AC power lines 200 to extract energy from the AC power lines 200 to generate the necessary voltage and current levels necessary for powering the measurement circuit 225, the data analyzer 230, the data storage 235, the communication port 250 and the power line communication port 90. Optionally, the power supply may supply the required voltage and current to the display 25 and the optional control panel 245. The structure and operation of the power supply 83 is as described above in FIG. 8.

This invention can also be upgraded so that this load center meter device can communicate with other meters at the residence, e.g. water meter, gas meter, to name a few. This information can now also be sent to water and gas suppliers for billing or other purposes.

While the present invention has been particularly described in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A self contained kilowatt-hour meter, comprising:
   a) a meter housing having at least two openings for the passage of at least one electrical connection;
   b) a middle assembly comprising:
      at least one printed circuit board,
      at least two toroidal transformers,
      at least two openings for the passage of at least one electrical connection, such that each of said toroidal transformers is adjacent each opening for the passage of at least one electrical connection, such that said toroidal transformers are placed adjacent a load center main for generating a current signal proportional to that of said load center main, and at least one resistive divider for generating voltage signals which is directly proportional to said main voltage; and at least one integrated circuit capable of measuring energy in communication with the toroidal transformer and the at least one resistive divider to receive said current signals and voltage signals such that said signals are scaled, filtered, and sent to, and said resulting measured energy is sent to at least one display device;

c) a meter cover having at least two openings for the passage of at least one electrical connection; and d) at least one securing means to secure said meter cover to said meter housing such that said middle assembly is contained inside said meter cover and said meter housing, and wherein each of said at least two openings for the passage of at least one electrical connection are substantially aligned each with other, and thereby forming said self contained kilowatt-hour meter.

2. The self contained kilowatt-hour meter of claim 1, wherein said meter housing has at least one standoff to support at least a portion of said middle assembly.

3. The self contained kilowatt-hour meter of claim 1, wherein said meter housing has at least one opening to accommodate at least one display device.

4. The self contained kilowatt-hour meter of claim 1, wherein said meter housing has at least one opening to accommodate at least one display device, and wherein said at least one display device is a digital display device.

5. The self contained kilowatt-hour meter of claim 1, wherein said meter housing has at least one opening to accommodate at least one display device, and said meter cover has at least one protrusion to securely hold said display device inside said at least one opening.

6. The self contained kilowatt-hour meter of claim 1, wherein said toroidal transformers are substantially concentrically aligned with said opening in said middle assembly.

7. The self contained kilowatt-hour meter of claim 1, wherein said middle assembly has at least one means to securely align it inside said meter housing.

8. The self contained kilowatt-hour meter of claim 1, wherein said self contained kilowatt-hour meter is secured to a main breaker.

9. The self contained kilowatt-hour meter of claim 1, wherein said self contained kilowatt-hour meter is secured to a main breaker via a meter mounting bracket.

10. The self contained kilowatt-hour meter of claim 1, wherein said self contained kilowatt-hour meter is secured to a main breaker via a meter mounting bracket, and wherein said meter mounting bracket has at least two lock nuts to secure at least one electrical connection.

11. The self contained kilowatt-hour meter of claim 1, wherein said self contained kilowatt-hour meter is secured to a main breaker, and wherein said main breaker is secured to a load center.

12. The self contained kilowatt-hour meter of claim 1, wherein said self contained kilowatt-hour meter is secured to a main breaker via a meter mounting bracket, and wherein said main breaker is secured to a load center.

13. The self contained kilowatt-hour meter of claim 1, wherein said self contained kilowatt-hour meter communicates with at least one data concentrator via at least one wireless protocol.

14. The self contained kilowatt-hour meter of claim 1, wherein said self contained kilowatt-hour meter communicates with at least one data concentrator via at least one wireless protocol, wherein said at least one wireless protocol is selected from a group consisting of a wireless at 900 MHz, a wireless mesh at 2.4 GHz, a wireless cellular at 1.9 GHz, a WiFi network.

15. The self contained kilowatt-hour meter of claim 1, wherein said self contained kilowatt-hour meter communicates with at least one data concentrator via at least one wireless protocol, and wherein said data concentrator communicate with at least one other device using at least one communication means, and wherein said at least one communication means is selected from a group consisting of a wireless protocol, an Ethernet connection, and a WiFi network.

16. The self contained kilowatt-hour meter of claim 1, wherein said self contained kilowatt-hour meter communicates with at least one data concentrator via at least one wireless protocol, and wherein said data concentrator communicates with at least one local energy usage display device.

17. The self contained kilowatt-hour meter of claim 1, wherein:

said printed circuit board has at least one power supply circuit which creates a regulated low voltage DC power from an AC main by rapidly switching said main on and off via a high voltage FET, said resulting pulsed voltage is then filtered using at least one capacitor and fed into at least one linear voltage regulators to provide stable low voltage power for at least one microprocessor and at least one ASIC.

18. The self contained kilowatt-hour meter of claim 17, wherein said at least one ASIC is capable of measuring active, reactive, apparent energy, RMS, instantaneous values for current and voltage, and line frequency information.

19. The self contained kilowatt-hour meter of claim 17, wherein said power supply circuit has at least one feedback circuit to control said turn on/off timing.

20. The self contained kilowatt-hour meter of claim 17, wherein said measured energy is transmitted to at least one device, and wherein said device is selected from a group consisting of a digital display device, a local receiving device, and a remote receiving device.

21. An electrical load center comprising: a) at least one main circuit breaker connected to AC power lines for transferring electrical energy for use by a local user or resident; and b) a load center meter proximal to the at least one main circuit breaker comprising: an enclosure containing at least two openings through which at least one AC power line is conveyed through each opening to connect to the at least one main circuit breaker; and a load center meter connected for monitoring the electrical energy used by the local user or resident, said load center comprising: at least one current sense device for sensing a current transferred through the at least one power line and generating a current signal representing the current on the AC power line, at least one voltage sense device for sensing a voltage present on the at least one AC power line and generating a signal representing the voltage present on the at least one AC power line, a measurement circuit in communication with the at least one current sense device and the at least one voltage sense device for determining an active, reactive, and apparent energy level, RMS (root mean square) and instantaneous values for current and voltage, and line frequency information of the electrical energy used by the local user or resident, a data analyzer analyzes the active, reactive, and apparent energy, RMS and instantaneous values for current and voltage, and line frequency information to create the energy usage data, and a data storage device in communication with the data analyzer to receive and retain the active, reactive, and apparent energy, RMS and the instantaneous values for current and voltage, the line frequency information, and the energy usage data.

22. The load center of claim 21 wherein the load center meter further comprises a current scaling device connected between the current sense device and the measurement circuit for scaling the current signal to a level acceptable by the measurement circuit.

23. The load center of claim 21 wherein the load center meter further comprises a voltage scaling device connected between the voltage sense device and the measurement circuit for scaling the voltage signal to a level acceptable by the measurement circuit.

24. The load center of claim 21 wherein the load center meter further comprises a communication port for transferring the energy usage data to the local user or resident or to an energy provider.

25. The load center of claim 24 wherein the communication port is a synchronous asynchronous communications port, a power line communications port, or a wireless communication port.

26. The load center of claim 25 wherein the power line communication port is connected to the at least one AC power line for transmission of the energy usage data to the local user or resident or the energy provider through a personal computer or a data concentrator connected to receive the energy usage data from the at least one AC power line.

27. The load center of claim 21 wherein the load center meter further comprises a display in communication with the data analyzer for display of the energy usage data.

28. The load center of claim 21 wherein the load center meter further comprises a control panel for programming, maintenance, or diagnostics of the load center meter.

29. The load center of claim 24 wherein the data analyzer, the data storage device, and the communications port are incorporated in a microprocessor that executes program code to cause the microprocessor to perform the functions of the data analyzer, the data storage device, and the communications port.

30. A load center meter proximal to at least one main circuit breaker within a load center comprising: a) an enclosure containing at least two openings through which at least one AC power line is conveyed through each opening to connect to the at least one main circuit breaker; and b) a load center meter place within the enclosure connected for monitoring the electrical energy used by the local user or resident, said load center comprising: at least one current sense device for sensing a current transferred through the at least one power line and generating a current signal representing the current on the AC power line, at least one voltage sense device for sensing a voltage present on the at least one AC power line and generating a signal representing the voltage present on the at least one AC power line, a measurement circuit in communication with the at least one current sense device and the at least one voltage sense device for determining an active, reactive, and apparent energy level, RMS (root mean square) and instantaneous values for current and voltage, and line frequency information of the electrical energy used by the local user or resident, a data analyzer analyzes the active, reactive, and apparent energy, RMS and instantaneous values for current and voltage, and line frequency information to create the energy usage data, and a data storage device in communication with the data analyzer to receive and retain the active, reactive, and apparent energy, RMS and the instantaneous values for current and voltage, the line frequency information, and the energy usage data.

31. The load center meter of claim 30 further comprises a current scaling device connected between the current sense device and the measurement circuit for scaling the current signal to a level acceptable by the measurement circuit.

32. The load center meter of claim 30 wherein the load center meter further comprises a voltage scaling device connected between the voltage sense device and the measurement circuit for scaling the voltage signal to a level acceptable by the measurement circuit.

33. The load center meter of claim 30 wherein the load center meter further comprises a communication port for transferring the energy usage data to the local user or resident or to an energy provider.

34. The load center meter of claim 33 wherein the communication port is a synchronous asynchronous communications port, a power line communications port, or a wireless communication port.

35. The load center meter of claim 34 wherein the power line communication port is connected to the at least one AC power line for transmission of the energy usage data to the local user or resident or the energy provider through a personal computer or a data concentrator connected to receive the energy usage data from the at least one AC power line.

36. The load center meter of claim 30 wherein the load center meter further comprises a display in communication with the data analyzer for display of the energy usage data.

37. The load center meter of claim 30 wherein the load center meter further comprises a control panel for programming, maintenance, or diagnostics of the load center meter.

38. The load center meter of claim 33 wherein the data analyzer, the data storage device, and the communications port are incorporated in a microprocessor that executes program code to cause the microprocessor to perform the functions of the data analyzer, the data storage device, and the communications port.

* * * * *